United States Patent [19]
Nagaraj

[11] Patent Number: 5,835,049
[45] Date of Patent: Nov. 10, 1998

[54] AMPLIFIER FOR USE IN TIME-SHARING APPLICATIONS

[75] Inventor: Krishnaswamy Nagaraj, Somerville, N.J.

[73] Assignee: Lucent Technologies Inc., Murray Hill, N.J.

[21] Appl. No.: 828,977

[22] Filed: Mar. 27, 1997

[51] Int. Cl.$^6$ .................................................. H03M 1/72
[52] U.S. Cl. ................................................ 341/161; 330/9
[58] Field of Search ..................................... 341/161, 155; 330/9, 51; 327/52, 53, 65, 389, 563, 96

[56] References Cited

U.S. PATENT DOCUMENTS

| | | | |
|---|---|---|---|
| 3,586,989 | 6/1971 | Wheable | 330/51 |
| 5,212,486 | 5/1993 | Nagaraj | 341/172 |
| 5,594,445 | 1/1997 | Ginetti | 341/162 |

OTHER PUBLICATIONS

"Efficient Circuit Configurations for Algorithmic Analog to Digital Converters", by Krishnaswami Nagaraj, IEEE Transactions on Circuits and Systems—II: Analog and Digital Signal Processing, vol. 40, No. 12, Dec. 1993, pp. 777–785.
"A 10–b 20–Msample / s Analog–to–Digital Converter", by Stephen H. Lewis et al., IEEE Journal of of Solid–State Circuits, vol. 27. No. 3 Mar. 1992, pp. 351–358.
All –MOS Charge Redistribution Analog–to–Digital Conversion Techniques–Part 1, James L. McCreary and Paul R. Gray, IEEE Journal of Solid–State Circuits, vol. SC–10, No. 6, Dec. 1975, pp. 371–379.

*Primary Examiner*—Howard L. Williams
*Assistant Examiner*—Peguy JeanpPierre

[57] ABSTRACT

A differential amplifier has (at least) four input-stage transistors that are switchably coupled to the inverting and noninverting input terminals and to the output terminal(s). In one embodiment, two of the transistors are permanently coupled between the input and output terminals, while the other two transistors are switchably coupled the input and output terminals, such that, during two-phased operations, each of the switchably coupled transistors is alternately connected in parallel to a different one of the two permanently coupled transistors. In this way, any charge (due to input capacitance) in one input-stage transistor from the previous clock phase will tend to negate similar charge in another input-stage transistor at the start of each clock phase. Such an amplifier can be efficiently used in time-sharing applications. For example, when used as the amplifier shared between two stages of a pipelined analog-to-digital converter, crosstalk between stages otherwise due to input capacitance of the amplifier can be reduced and possibly eliminated.

14 Claims, 6 Drawing Sheets

AMPLIFIER FOR USE IN TIME-SHARING APPLICATIONS

BACKGROUND OF THE INVENTION

1. Cross-Reference to Related Application

This patent application is being filed concurrently with U.S. patent application Ser. No. 08/826,414, entitled "Analog-to-Digital Converter Having Amplifier and Comparator Stages," by Krishnaswamy Nagaraj ("Nagaraj 17"), assigned to the same assignee and herein incorporated by reference.

2. Field of the Invention

The present invention is related to electrical circuits, and, in particular, to amplifiers for use in analog-to-digital conversion.

3. Description of the Related Art

Pipelined analog-to-digital (A/D) converters are very commonly used in high-speed data converters. For example, a switched-capacitor algorithmic pipelined A/D converter is described in Lewis et al., "A 10-b 20-Msample/s Analog-to-Digital Converter," *IEEE Journal of Solid-State Circuits*, Vol. 27, No. 3, pp. 351–358, March 1992, the teachings of which are incorporated herein by reference. Such a converter employs a pipeline of N−1 stages for an N-bit converter, where each stage comprises an analog arithmetic unit followed by a two-level decision circuit, and the analog arithmetic unit operation is performed by using a switched-capacitor network and an operational amplifier. The first stage accepts the analog input and produces a pair of decision bits (containing the equivalent of 1.5 binary bits of information) and an analog residue. These are passed on to the second stage, which treats the analog residue as its input and produces another 1.5 bits of information, as well as a new analog residue. This process continues until the residue reaches the last stage. The decision bits from all the stages represent a total of 1.5(N−1) bits of information. This means that redundancy exists within the bits of information. These are processed by a digital correction block that removes the redundancy and produces the final N-bit output. Any decision errors are corrected in this process.

Nagaraj, "Efficient Circuit Configurations For Algorithmic Analog-To-Digital Converters," *IEEE Transactions On Circuits Systems-II: Analog and Digital Signal Processing*, Vol. 40, No. 2, December, 1993, pp. 777–785 ("the Nagaraj article"), herein incorporated by reference, describes an A/D converter in which each amplifier is time-shared between two stages of the A/D converter, thereby reducing the total number of amplifiers used in such an A/D converter by a factor of two. For example, for a 10-bit pipelined A/D converter, five amplifiers are employed using the time-sharing technique described in the Nagaraj article.

According to this time-sharing technique, each amplifier in the A/D converter is alternately used by two different stages of the A/D converter. In such a circuit, input capacitance in amplifiers can lead to crosstalk between stages sharing a single amplifier. It is therefore important, for such A/D converters, to design amplifiers that reduce the effects of input capacitance in order to limit the adverse effects of crosstalk.

SUMMARY OF THE INVENTION

Embodiments of the present invention are directed to integrated circuits having a differential amplifier comprising an inverting input terminal and a noninverting input terminal and at least one output terminal. Four transistors, forming an input stage of the differential amplifier, are coupled to the inverting and noninverting input terminals and to the output terminal, such that at least two of the amplifiers are capable of being switched between the inverting and noninverting input terminals on different phases of a clock signal capable of driving the differential amplifier.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Embodiments of the present invention are directed to an amplifier designed to be used, for example, in a time-sharing pipelined analog-to-digital converter. The amplifier is designed to have low input capacitance. When used, for example, in a time-sharing pipelined A/D converter, such an amplifier can reduce crosstalk between stages that share a single amplifier.

Figure 1:
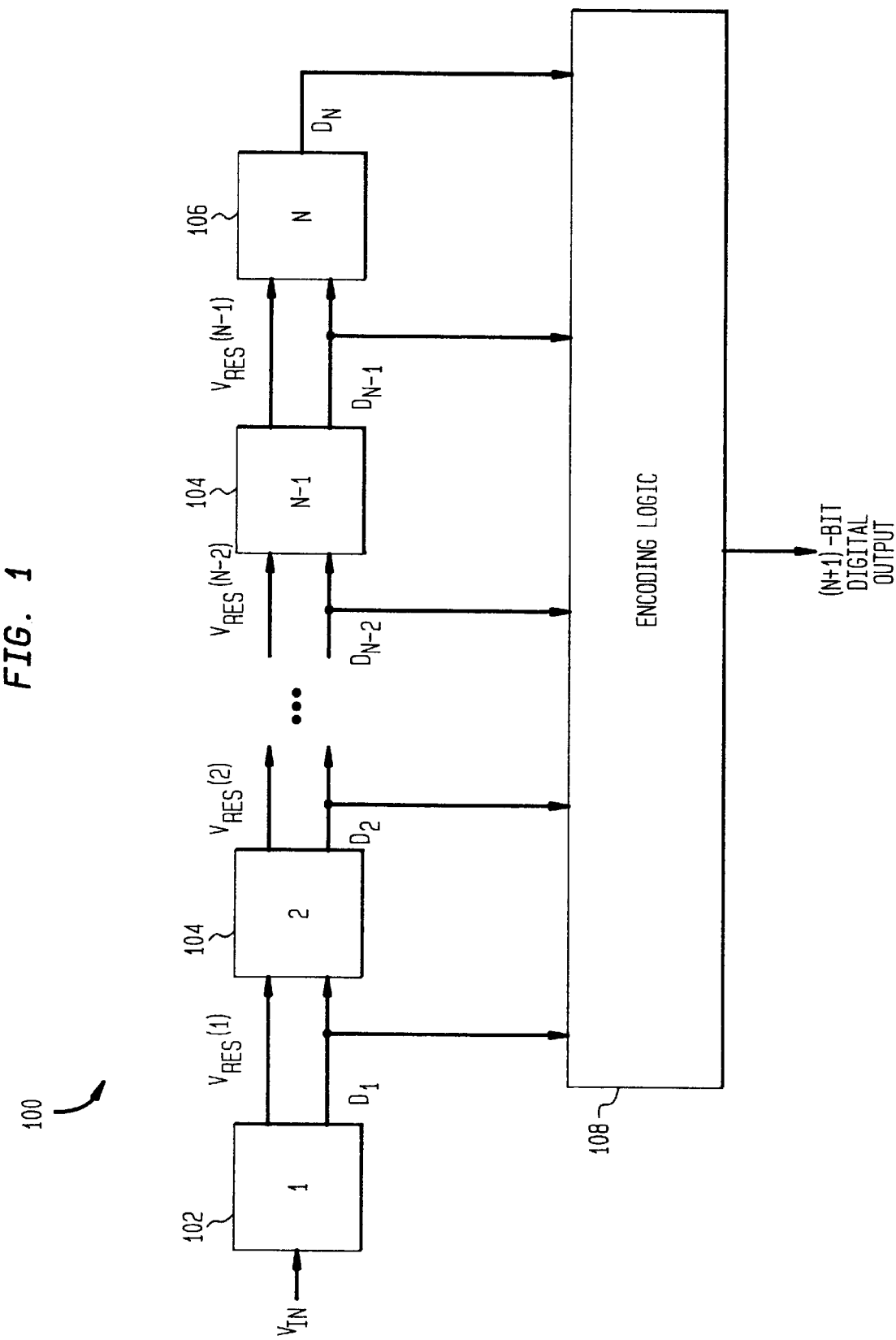
FIG. 1 shows a block diagram of a pipelined analog-to-digital converter, according to one embodiment of the present invention.

FIG. 1 shows a block diagram of a pipelined analog-to-digital converter 100, according to one embodiment of the present invention. A/D converter 100 is an N-stage converter that converts an analog input signal $V_{IN}$, into an (N+1)-bit digital output signal. In one implementation, A/D converter 100 has three different types of stages: initial stage 102 (Stage 1), intermediate stages 104 (Stages 2 through N−1), and final stage 106 (Stage N).

Initial stage 102 receives the analog input signal $V_{IN}$ and generates two output signals: an analog residue signal $V_{RES}(1)$ and a two-bit (one-of-three) digital output signal $D_1$. The $j^{th}$ intermediate stage 104 receives the two output signals generated by the previous stage (i.e., the analog residue signal $V_{RES}(j-1)$ and the two-bit digital output signal $D_{j-1}$) and generates two output signals: an analog residue signal $V_{RES}(j)$ and a two-bit digital output signal $D_j$. The final stage 106 receives the two output signals from the $(N-1)^{th}$ stage (i.e., the analog residue signal $V_{RES}(N-1)$ and the two-bit digital output signal $D_{N-1}$) and generates a two-bit digital output signal $D_N$.

For each analog input signal $V_{IN}$, encoding logic 108 receives N two-bit digital output signals ($D_1, \ldots, D_N$) from the N stages. Those skilled in the art will understand that each two-bit digital output signal corresponds to 1.5 bits of information. (In alternative implementations, each stage of an A/D converter of the present invention may generate a digital output signal having other than two bits (i.e., one bit or more than two bits).) Encoding logic 108 applies error-correction logic processing to the N two-bit digital output signals to remove redundancy and generate the (N+1)-bit digital equivalent to $V_{IN}$. This approach to A/D conversion is described generally in the Nagaraj article.

A/D converter 100 may be operated in a pipelined manner. Consider the sequence of analog input signals ($V_{INA}$, $V_{INB}$, $V_{INC}$, $V_{IND}$, ...), where $V_{INA}$ is the first input, $V_{INB}$ is the second input, and so forth. A/D converter 100 may be used to digitize that sequence in the following steps:

Step (1): Stage 1 receives $V_{INA}$ and generates $V_{RES}(1)$ and $D_1$ for $V_{INA}$.

Step (2): While Stage 2 receives $V_{RES}(1)$ and $D_1$ for $V_{INA}$ and generates $V_{RES}(2)$ and $D_2$ for $V_{INA}$, Stage 1 receives $V_{INB}$ and generates $V_{RES}(1)$ and $D_1$ for $V_{INB}$.

Step (3): While Stage 3 receives $V_{RES}(2)$ and $D_2$ for $V_{INA}$ and generates $V_{RES}(3)$ and $D_3$ for $V_{INA}$, and while Stage 2 receives $V_{RES}(1)$ and $D_1$ for $V_{INB}$ and generates $V_{RES}(2)$ and $D_2$ for $V_{INB}$, Stage 1 receives $V_{INC}$ and generates $V_{RES}(1)$ and $D_1$ for $V_{INC}$.

Step (4): While Stage 4 receives $V_{RES}(3)$ and $D_3$ for $V_{INA}$ and generates $V_{RES}(4)$ and $D_4$ for $V_{INA}$, and while Stage 3 receives $V_{RES}(2)$ and $D_2$ for $V_{INB}$ and generates $V_{RES}(3)$ and $D_3$ for $V_{INB}$, and while Stage 2 receives $V_{RES}(1)$ and $D_1$ for $V_{INC}$ and generates $V_{RES}(2)$ and $D_2$ for $V_{INC}$, Stage 1 receives $V_{IND}$ and generates $V_{RES}(1)$ and $D_1$ for $V_{IND}$.

Step (5): etc.

In this way, A/D converter 100 can efficiently convert a sequence of analog input signals $V_{IN}$ into a sequence of (N+1)-bit digital output signals. It will be understood, of course, that A/D converter 100 can be operated to convert analog input signals into digital output signals one at a time in a non-pipelined manner.

Figure 2:
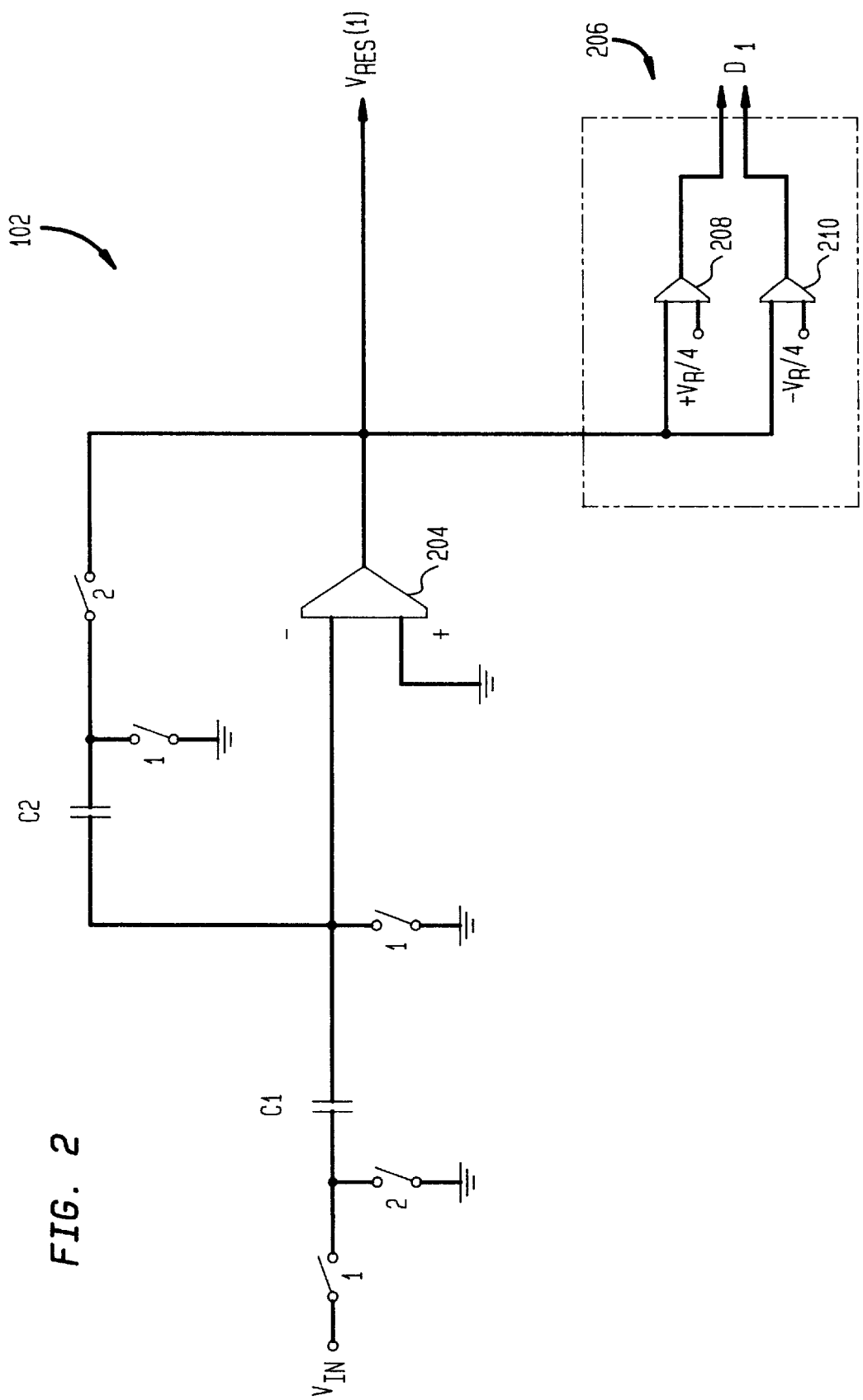
FIG. 2 shows a schematic diagram of the initial stage of the A/D converter of FIG. 1.

FIG. 2 shows a schematic diagram of initial stage 102 of A/D converter 100 of FIG. 1, according one embodiment of the present invention. In general, initial stage 102 receives the analog input signal $V_{IN}$ and generates the analog residue signal $V_{RES}(1)$ and the two-bit digital output signal $D_1$. The operations of initial stage 102 are described in further detail in Nagaraj 17.

Figure 3:
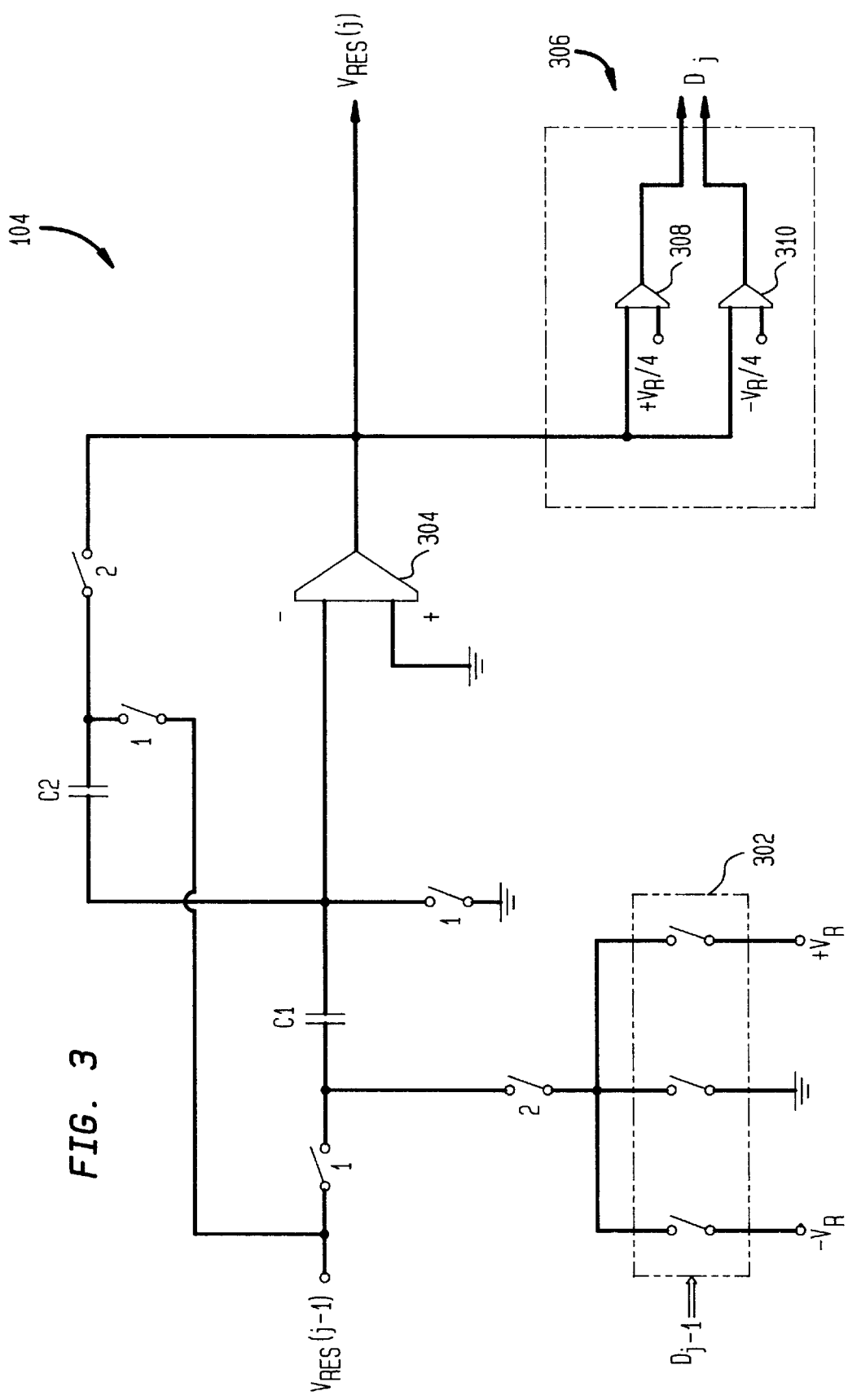
FIG. 3 shows a schematic diagram of each intermediate stage of the A/D converter of FIG. 1.

FIG. 3 shows a schematic diagram of each intermediate stage 104 of A/D converter 100 of FIG. 1, according to one embodiment of the present invention. In general, the $j^{th}$ intermediate stage 104 receives analog residue signal $V_{RES}(j-1)$ and digital output signal $D_{j-1}$ from the previous stage of A/D converter 100 and generates analog residue signal $V_{RES}(j)$ and digital output signal $D_j$. The operations of intermediate stage 104 are described in further detail in Nagaraj 17.

Figure 4:
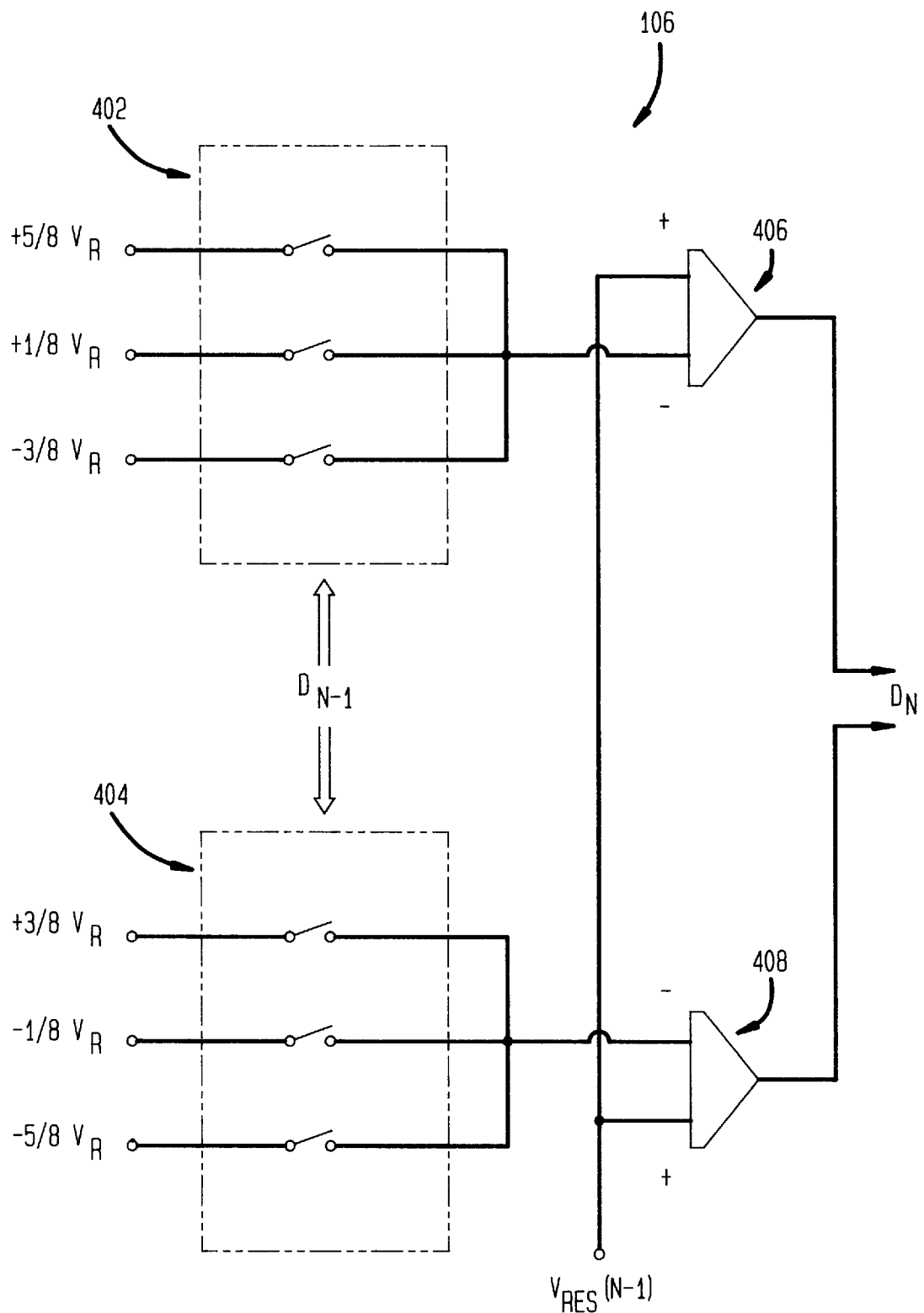
FIG. 4 shows a schematic diagram of the final stage of the A/D converter of FIG. 1.

FIG. 4 shows a schematic diagram of final stage 106 of A/D converter 100 of FIG. 1, according to one embodiment of the present invention. Final stage 106 receives analog residue signal $V_{RES}(N-1)$ and digital output signal $D_{N-1}$ from the second-to-last stage (i.e., Stage N-1 of FIG. 1), and generates the final two-bit digital output signal $D_N$. The operations of final stage 106 are described in further detail in Nagaraj 17.

Figure 5:
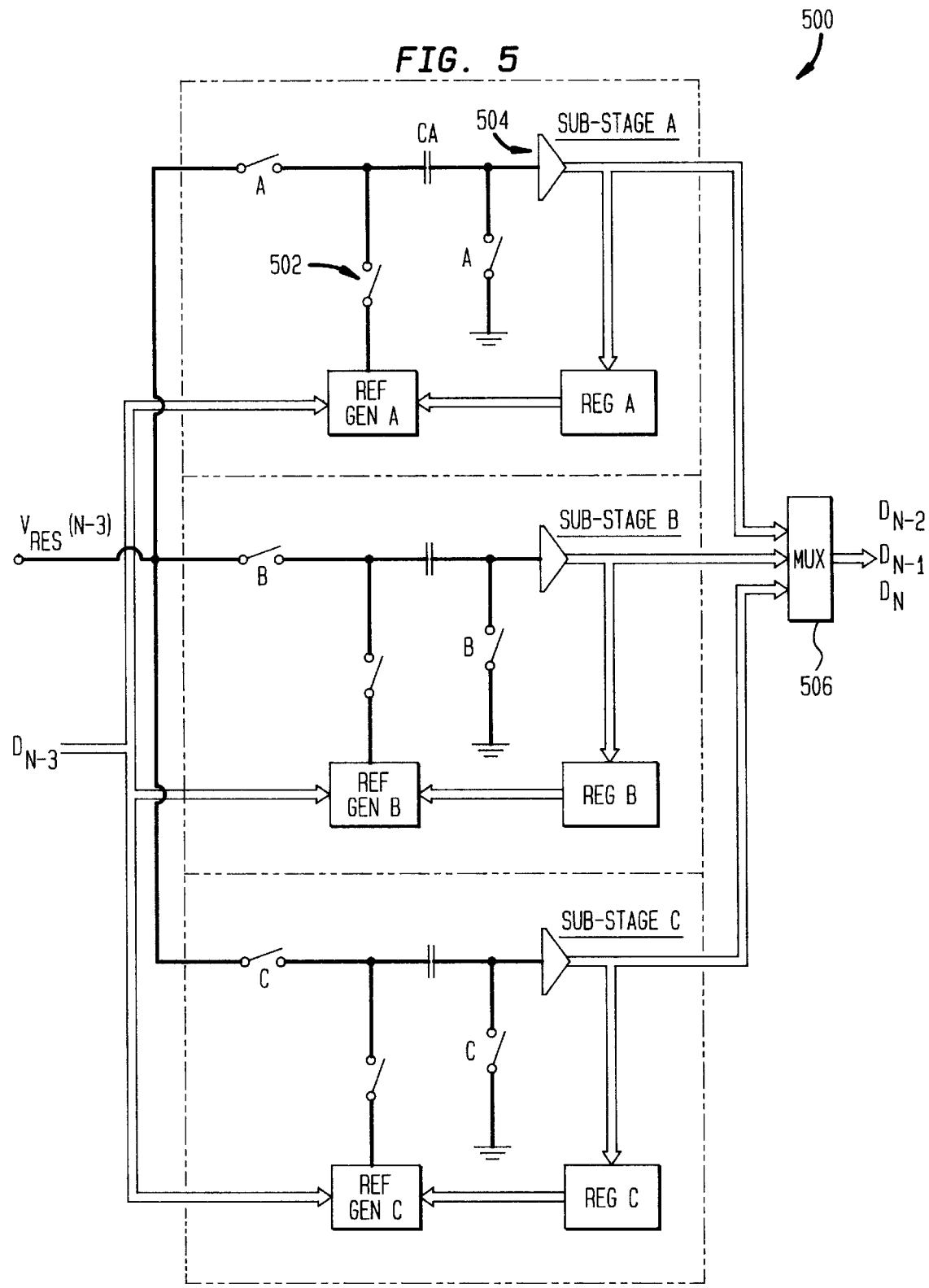
FIG. 5 shows a schematic diagram of a circuit that may be used to replace the last three stages of the A/D converter of FIG. 1, according to an alternative embodiment of the present invention.

FIG. 5 shows a schematic diagram of circuit 500. In an alternative embodiment of the present invention, circuit 500 may be used to replace the last three stages of A/D converter 100 of FIG. 1 (i.e., Stages N-2, N-1, and N). For each original analog input signal $V_{IN}$, circuit 500 receives the analog residue signal $V_{RES}(N-3)$ and the two-bit digital output signal $D_{N-3}$ from Stage N-3, and sequentially generates three two-bit digital output signals (i.e., $D_{N-2}$, $D_{N-1}$, and $D_N$). Circuit 500 has three parallel sub-stages (Sub-Stages A, B, and C) that operate in analogous fashion. The operations of circuit 500 are described in further detail in Nagaraj 17.

According to preferred embodiments of the present invention, A/D converter 100 employs the time-sharing technology described in the Nagaraj article. According to that technology, Stage 1 (initial stage 102) and Stage 2 (the first intermediate stage 104) of FIG. 1 share a single amplifier. Similarly, each subsequent pair of intermediate stages 104 shares a different single amplifier. According to this time-sharing technology, two stages that share a single amplifier operate out of phase with one another. That is, while one stage is sampling the residue voltage from its previous stage, the other stage is using the shared amplifier to generate a new residue voltage and a new two-bit digital output signal based on a previously sampled residue voltage and a previously received two-bit digital output signal from its previous stage.

When operated in a pipelined manner, an amplifier that is time-shared between intermediate Stages j and j+1 may be said to operate as follows:

Step (1): Stage j samples $V_{RES}(j-1)$ from Stage j-1 corresponding to the first input signal $V_{INA}$.

Step (2): While Stage j uses the amplifier to generate $V_{RES}(j)$ and $D_j$ corresponding to $V_{INA}$, Stage j+1 samples $V_{RES}(j)$ from Stage j corresponding to $V_{INA}$.

Step (3): While Stage j+1 uses the amplifier to generate $V_{RES}(j+1)$ and $D_{j+1}$ corresponding to $V_{INA}$, Stage j samples $V_{RES}(j-1)$ from Stage j-1 corresponding to the second input signal $V_{INB}$.

Step (4): While Stage j uses the amplifier to generate $V_{RES}(j)$ and $D_j$ corresponding to $V_{INB}$, Stage j+1 samples $V_{RES}(1)$ from Stage j corresponding to $V_{INB}$.

Step (5): While Stage j+1 uses the amplifier to generate $V_{RES}(j+1)$ and $D_{j+1}$, corresponding to $V_{INB}$, Stage j samples $V_{RES}(j-1)$ from Stage j-1 corresponding to the third input signal $V_{INC}$.

Step (6): While Stage j uses the amplifier to generate $V_{RES}(j)$ and $D_j$ corresponding to $V_{INC}$, Stage j+1 samples $V_{RES}(j)$ from Stage j corresponding to $V_{INC}$.

Step (7): etc.

In this way, the same amplifier is alternately used by two different stages in the A/D converter to generate analog residual signals and two-bit digital output signals corresponding to successive input signals. As taught in the Nagaraj article, the A/D converter has switches and other circuit elements to achieve this amplifier time-sharing feature.

Due to the finite gain of a shared amplifier, the input voltage of the amplifier assumes a non-zero value equal to $-V_{OUT}/A$, wherein $V_{OUT}$ is the amplifier output (e.g., $V_{RES}$) and A is the amplifier gain. The input capacitance of the amplifier gets charged to this voltage. When the amplifier is shared between two stages, it gets switched from one stage to another and the charge carried by the amplifier input capacitance can result in a crosstalk between the two stages. This can be a serious problem in many signal-processing applications.

Figure 6:
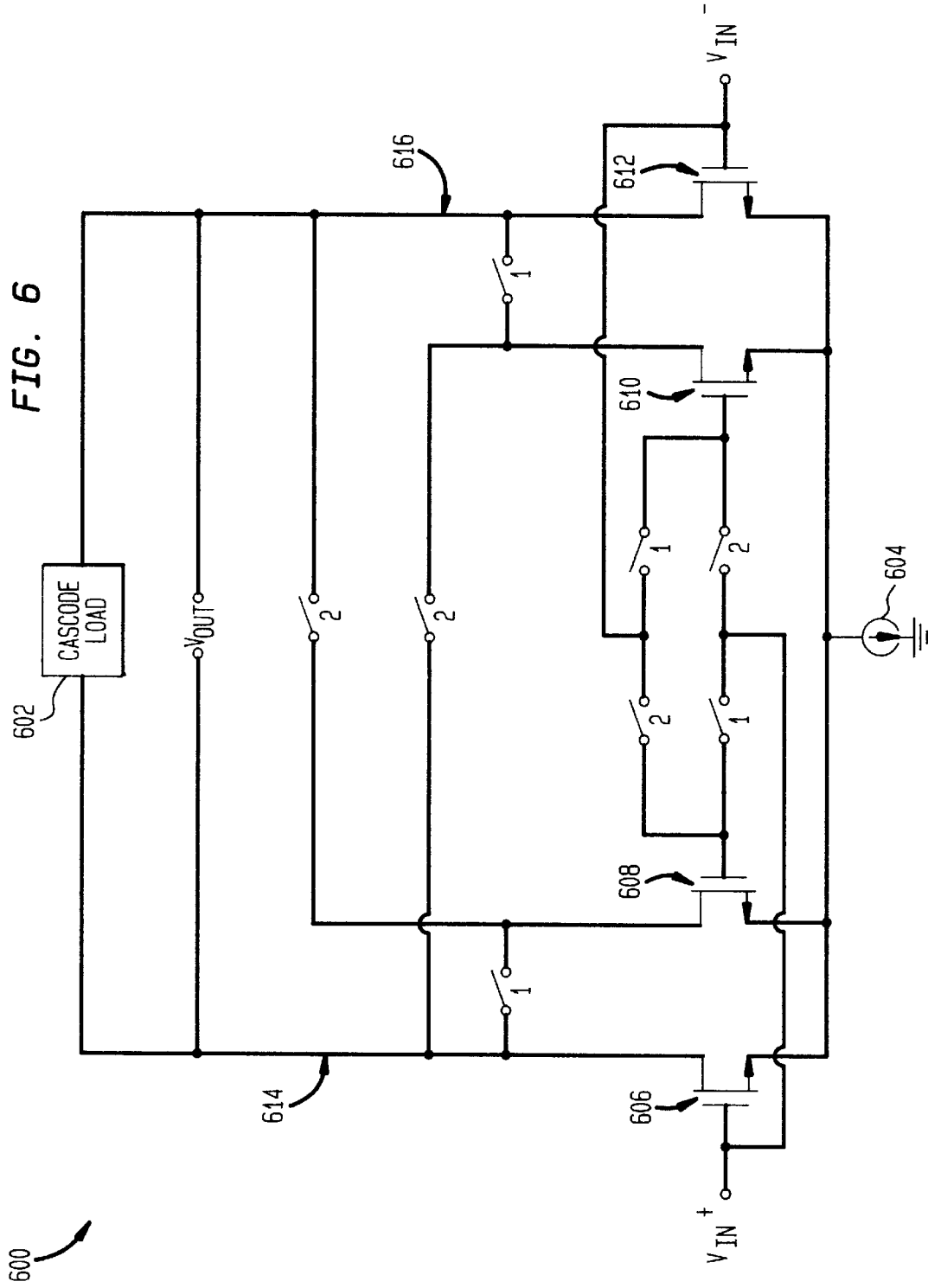
FIG. 6 shows a schematic diagram of an amplifier that may be used in a time-shared manner in the initial and intermediate stages of the A/D converter of FIG. 1, according to one embodiment of the present invention.

FIG. 6 shows a schematic diagram of an amplifier 600 that may be used in a time-shared manner in the initial and intermediate stages of A/D converter 100 of FIG. 1, according one embodiment of the present invention. Amplifier 600 comprises load 602, current source 604, and four transistors 606, 608, 610, and 612 (e.g., metal-oxide semiconductor (MOS) transistors). These transistors operate as the input stage to amplifier 600, which receives a differential input $V_{IN}^+$, $V_{IN}^-$ and generates an output $V_{OUT}$. Amplifier 600 also has a plurality of switches 1 and 2, which may be implemented using additional MOS transistors. Switches 1 and 2 control the operations of amplifier 600 according to two phases of an input clock signal.

In particular, during clock phase 1, switches 1 are closed and switches 2 are opened. As shown in FIG. 6, during clock phase 1, the gates of transistors 606 and 608 are both coupled to the noninverting input signal terminal $V_{IN}^+$, while the gates of transistors 610 and 612 are both coupled to the inverting input signal terminal $V_{IN}^-$. Furthermore, during clock phase 1, the drains of transistors 606 and 608, are shorted together, while the drains of transistors 610 and 612 are shorted together. Thus, during clock phase 1, transistors 606 and 608 are connected in parallel to one another, while transistors 610 and 612 are connected in parallel to one another.

Similarly, during clock phase 2, switches 1 are opened and switches 2 are closed. As shown in FIG. 6, during clock phase 2, the gates of transistors 606 and 610 are both coupled to the noninverting input signal terminal $V_{IN}^+$, while the gates of transistors 608 and 612 are both coupled to the inverting input signal terminal $V_{IN}^-$. Furthermore, during clock phase 2, the drains of transistors 606 and 610 are shorted together, while the drains of transistors 608 and 612 are shorted together. Thus, during clock phase 2, transistors 606 and 610 are connected in parallel to one another, while transistors 608 and 612 are connected in parallel to one another.

In either clock phase, the application of a differential input signal to the inverting and noninverting input terminals $V_{IN}^-$, $V_{IN}^+$ of the amplifier produces current flow along signal paths 614 and 616. When this current flow is applied to load 602, the output voltage $V_{OUT}$ for the amplifier is generated. Load 602 may be, but is not limited to being, a cascode load.

Amplifier 600 of FIG. 6 may be used for each time-shared amplifier in A/D converter 100 of FIG. 1, where the phasing of amplifier 600 is controlled by the same clock signal that controls the phasing of the amplifier time-sharing described earlier. By alternately switching the gates of transistors 608 and 610 between the inverting and noninverting input terminals of the amplifier, any charge associated with the input capacitances of transistors 606 and 612 is reduced and potentially neutralized, at the beginning of each clock phase, by an opposite charge associated with the input capacitances of transistors 608 and 610. As such, crosstalk between amplifier-sharing stages of A/D converter 100 due to input amplifier capacitance can be reduced and potentially eliminated.

More specifically, at the beginning of clock phase 1, transistor 608 is coupled in parallel with transistor 606. Because transistor 608 was coupled to the inverting input terminal $V_{IN}^-$ during the previous clock phase 2, the charge on its input capacitance would be opposite and of potentially equal magnitude to the charge on the input capacitance of transistor 606. These cancel each other when transistor 608 is coupled in parallel with transistor 606. Similarly, the charge on transistor 610 cancels the charge on transistor 612 at the beginning of clock phase 1; the charge on transistor 610 cancels the charge on transistor 606 at the beginning of clock phase 2; and the charge on transistor 608 cancels the charge on transistor 612 at the beginning of clock phase 2.

In a practical implementation, one or more of switches 1 and 2 of FIG. 6 can be merged with the switches used to implement the amplifier time-sharing described earlier.

In the implementations described above, the present invention is applied to pipelined A/D converters having a final comparator-based stage as shown in either FIG. 4 or FIG. 5. The present invention may also be applied to pipelined A/D converters in which all of the stages are amplifier-based stages. Furthermore, the present invention may be applied to circuits other than A/D converters. In general, the present invention may be used for any circuit in which an amplifier is time-shared between two or more different operations.

Those skilled in the art will also understand that the present invention may be implemented as a single integrated circuit using solid-state technology or as a circuit having a plurality of discrete elements.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A differential amplifier having an inverting input terminal and a noninverting input terminal and at least one output terminal, comprising four transistors forming an input stage of the differential amplifier and coupled to the inverting and noninverting input terminals and to the output terminal, such that at least two of the transistors are capable of being switched between the inverting and noninverting input terminals on different phases of a clock signal capable of driving the differential amplifier.

2. The invention of claim 1, wherein the differential amplifier is time-shared between two or more operations.

3. The invention of claim 2, wherein the differential amplifier is time-shared between two stages of a pipelined analog-to-digital (A/D) converter.

4. The invention of claim 1, wherein:
   the gates of the first and fourth transistors are permanently coupled to the noninverting and inverting input terminals, respectively; and
   the second and third transistors are switchably coupled in parallel with the first and fourth transistors, such that:
      when the second transistor is coupled in parallel to the first transistor, the third transistor is coupled in parallel to the fourth transistor; and
      when the second transistor is coupled in parallel to the fourth transistor, the third transistor is coupled in parallel to the first transistor.

5. The invention of claim 4, wherein:
   the gates of the second and third transistors are switchably coupled to the noninverting and inverting input terminals, such that:
      when the gate of the second transistor is coupled to the noninverting input terminal, the gate of the third transistor is coupled to the inverting input terminal; and
      when the gate of the second transistor is coupled to the inverting input terminal, the gate of the third transistor is coupled to the noninverting input terminal; and
   the drains of the second and fourth transistors are switchably coupled to the drains of the first and fourth transistors, such that:
      when the drain of the second transistor is coupled to the drain of the first transistor, the drain of the third transistor is coupled to the drain of the fourth transistor; and
   when the drain of the second transistor is coupled to the drain of the fourth transistor, the drain of the third transistor is coupled to the drain of the first transistor.

6. The invention of claim 5, wherein the differential amplifier is time-shared between two or more operations.

7. The invention of claim 6, wherein the differential amplifier is time-shared between two stages of a pipelined A/D converter.

8. An integrated circuit having a differential amplifier comprising an inverting input terminal and a noninverting input terminal and at least one output terminal, the differential amplifier comprising four transistors forming an input stage of the differential amplifier and coupled to the inverting and noninverting input terminals and to the output terminal, such that at least two of the transistors are capable of being switched between the inverting and noninverting input terminals on different phases of a clock signal capable of driving the differential amplifier.

9. The invention of claim 8, wherein the differential amplifier is time-shared between two or more operations.

10. The invention of claim 9, wherein the differential amplifier is time-shared between two stages of a pipelined A/D converter.

11. The invention of claim 8, wherein:

the gates of the first and fourth transistors are permanently coupled to the noninverting and inverting input terminals, respectively; and the second and third transistors are switchably coupled in parallel with the first and fourth transistors, such that:
when the second transistor is coupled in parallel to the first transistor, the third transistor is coupled in parallel to the fourth transistor; and
when the second transistor is coupled in parallel to the fourth transistor, the third transistor is coupled in parallel to the first transistor.

12. The invention of claim 11, wherein:

the gates of the second and third transistors are switchably coupled to the noninverting and inverting input terminals, such that:
when the gate of the second transistor is coupled to the noninverting input terminal, the gate of the third transistor is coupled to the inverting input terminal; and
when the gate of the second transistor is coupled to the inverting input terminal, the gate of the third transistor is coupled to the noninverting input terminal; and the drains of the second and fourth transistors are switchably coupled to the drains of the first and fourth transistors, such that:
when the drain of the second transistor is coupled to the drain of the first transistor, the drain of the third transistor is coupled to the drain of the fourth transistor; and
when the drain of the second transistor is coupled to the drain of the fourth transistor, the drain of the third transistor is coupled to the drain of the first transistor.

13. The invention of claim 12, wherein the differential amplifier is time-shared between two or more operations.

14. The invention of claim 13, wherein the differential amplifier is time-shared between two stages of a pipelined A/D converter.

* * * * *